United States Patent
Kang et al.

(10) Patent No.: US 7,408,408 B2
(45) Date of Patent: Aug. 5, 2008

(54) PREDISTORTER FOR POWER AMPLIFIER

(75) Inventors: Hyun-Il Kang, Ansan-si (KR);
Young-Hwan Kim, Gyeonggi-do (KR);
Jae-Sup Lee, Yongin-si (KR);
Sang-Hyun Woo, Seoul (KR)

(73) Assignee: Samsung Electronics Co., Ltd (KR)

( * ) Notice: Subject to any disclaimer, the term of this patent is extended or adjusted under 35 U.S.C. 154(b) by 173 days.

(21) Appl. No.: 11/185,107

(22) Filed: Jul. 20, 2005

(65) Prior Publication Data

US 2006/0197595 A1 Sep. 7, 2006

(30) Foreign Application Priority Data

Mar. 4, 2005 (KR) .................. 10-2005-0018373

(51) Int. Cl.
*H03F 1/26* (2006.01)
(52) U.S. Cl. ..................................... 330/149
(58) Field of Classification Search ................. None
See application file for complete search history.

(56) References Cited

U.S. PATENT DOCUMENTS

| | | | |
|---|---|---|---|
| 3,952,260 A | 4/1976 | Prochazka et al. | 330/149 |
| 4,119,923 A | 10/1978 | Legendre et al. | 330/284 |
| 5,162,748 A * | 11/1992 | Katz | 330/149 |
| 5,798,854 A | 8/1998 | Blauvelt et al. | 398/194 |
| 5,939,920 A | 8/1999 | Hiraizumi | 327/306 |
| 6,111,477 A * | 8/2000 | Klymyshyn et al. | 333/139 |
| 6,222,412 B1 | 4/2001 | Jeon et al. | 327/320 |
| 6,307,436 B1 | 10/2001 | Hau | 330/149 |
| 6,400,222 B1 | 6/2002 | Takahashi | 330/149 |
| 6,404,823 B1 * | 6/2002 | Grange et al. | 375/297 |
| 6,724,253 B2 * | 4/2004 | Hau et al. | 330/149 |
| 6,806,767 B2 * | 10/2004 | Dow | 330/51 |
| 6,946,908 B1 * | 9/2005 | Sun et al. | 330/149 |
| 2002/0186082 A1 | 12/2002 | Hau et al. | 330/149 |

* cited by examiner

*Primary Examiner*—Robert J. Pascal
*Assistant Examiner*—Krista M Flanagan
(74) *Attorney, Agent, or Firm*—The Farrell Law Firm, PC

(57) ABSTRACT

A predistorter that linearizes the nonlinearity of a power amplifier in a system supporting a multimode and a multiband (frequency band). The predistorter includes a field-effect transistor, an impedance transform unit, a first inductor, a first capacitor, and a second capacitor. The field-effect transistor has a source connected to the ground and uses a variable gate bias voltage. The impedance transform unit is connected to a drain of the field-effect transistor to perform impedance transform. The first inductor is connected between the impedance transform unit and a voltage provided to the field-effect transistor. The first capacitor is connected between a power input terminal and the impedance transform unit. The second capacitor is connected between a power output terminal and the impedance transform unit.

8 Claims, 7 Drawing Sheets

PREDISTORTER FOR POWER AMPLIFIER

This application claims priority under 35 U.S.C. § 119 to an application entitled "Predistorter" filed in the Korean Intellectual Property Office on Mar. 4, 2005 and assigned Serial No. 2005-18373, the contents of which are incorporated herein by reference.

BACKGROUND OF THE INVENTION

1. Field of the Invention

The present invention relates generally to a predistorter, and in particular, to a predistorter for linearizing the nonlinearity of a power amplifier in a system supporting a multimode and a multiband (frequency band).

2. Description of the Related Art

With the development of mobile communication, a radio frequency (RF) system aims at providing a multimode and a multiband. Further, the RF system requires a small size, high efficiency, and high linearity. However, an amplifier of a transmitter in a mobile communication system consumes a large amount of power and also has nonlinearity, which causes degradation of the entire system.

Accordingly, research is being conducted on linearization of an amplifier. Among the research results, predistortion is a representative technique that can be miniaturized enough to be used in a mobile terminal for mobile communication.

FIG. 1 illustrates basic principles of a predistorter. Referring to FIG. 1, AM-AM distortion of a power amplifier exhibits a gain that decreases as an input power $P_{in}$ increases. In addition, AM-PM distortion exhibits a phase that increases or decreases as the input power $P_{in}$ increases. Therefore, the predistorter and the power amplifier have contrary characteristics, which achieve overall linearity.

FIG. 2 is a circuit diagram of a conventional parallel diode predistorter. Referring to FIG. 2, the conventional parallel diode predistorter includes a diode D2 having a cathode connected to the ground, a bias feed resistance R2 connected between an anode of the diode D2 and a bias voltage $V_{CC}$, a capacitor C21 connected between an input terminal IN and the anode of the diode D2, and a capacitor C22 connected between the anode of the diode D2 and an output terminal OUT.

In the conventional parallel diode predistorter, because a voltage $V_d$ at the diode D2 decreases as an input power increases, the resistance of the diode D2 increases. That is, as the input power increases, the conductance of the diode D2 decreases and thus a bias point changes as illustrated in FIG. 3.

In FIG. 3, L indicates a bias point when the input power is large, and S indicates a bias point when the input power is small.

In the conventional parallel diode predistorter, the capacitors C21 and C22 are arranged in parallel with the diode D2 to control a phase deviation, thereby controlling a susceptance.

Once a conductance G and a susceptance B according to an input power are acquired, a gain and a phase of a predistorter can be calculated using Equations (1) through (3).

$$S21 = \frac{2}{2 + Z_T Y} = \frac{2}{2 + Z_T Y} = \frac{2}{2 + Z_T(G + jB)} \quad (1)$$

$$|S21| = \frac{2}{\sqrt{(2 + Z_T G)^2 + (Z_T B)^2}} \quad (2)$$

$$\angle S21 = \tan^{-1}\left(\frac{-Z_T B}{2 + Z_T G}\right) \quad (3)$$

More specifically, Equation (2) calculates a gain of the predistorter and Equation (3) calculates a phase of the predistorter.

According to Equations (1) through (3), as the conductance G decreases, the size of S21, i.e., the gain of the predistorter, increases and the phase of S21, i.e., the phase of the predistorter, decreases with an increase in the input power.

However, to implement a predistorter suitable for a multimode and a multiband, the predistorter should have characteristics as illustrated in FIGS. 4 and 5. That is, the predistorter should provide a gain change 41, a free change in turning points 42 and 43 at which a gain starts to change according to an input power, free turns 44 and 45 of a gain, a phase change 46, a free change in turning points 47 and 48 at which a phase starts to change according to an input power, and free turns 49 and 50 of a phase.

However, because the conventional parallel diode predistorter illustrated in FIG. 2 should control the bias voltage $V_{CC}$ or use a buffer amplifier or an attenuator to control a turning point, it consumes a large amount of power and cannot provide gain and phase characteristics suitable for multimode, multiband power amplifiers.

SUMMARY OF THE INVENTION

Therefore, the present invention has been designed to provide a predistorter for linearizing the nonlinearity of a power amplifier in a system supporting a multimode and a multiband.

In addition, the present invention provides a predistorter that can be controlled to linearize various nonlinear characteristics of a power amplifier.

Further, the present invention provides a predistorter that changes a phase through impedance transform and controls a turning point at which a gain or a phase starts to change according to an input power using a bias voltage controlled by a field-effect transistor.

To achieve the above and other objects, there is provided a predistorter at the front end of a power amplifier to linearize the nonlinearity of the power amplifier. The predistorter includes a field-effect transistor, an impedance transform unit, a first inductor, a first capacitor, and a second capacitor. The field-effect transistor has a source connected to the ground and uses a variable gate bias voltage. The impedance transform unit is connected to a drain of the field-effect transistor to perform impedance transform. The first inductor is connected between the impedance transform unit and a voltage provided to the field-effect transistor. The first capacitor is connected between a power input terminal and the impedance transform unit. The second capacitor is connected between a power output terminal and the impedance transform unit.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENT

Preferred embodiments of the present invention will now be described in detail with reference to the annexed drawings.

Figure 1:
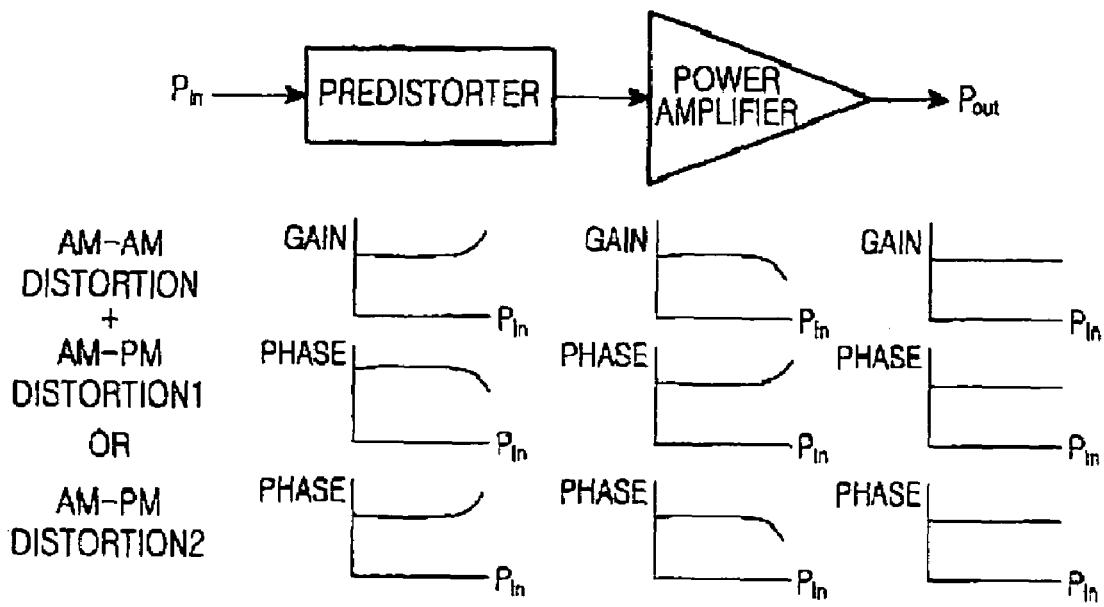
FIG. 1 is a view illustrating basic principles of a predistorter.
Figure 2:
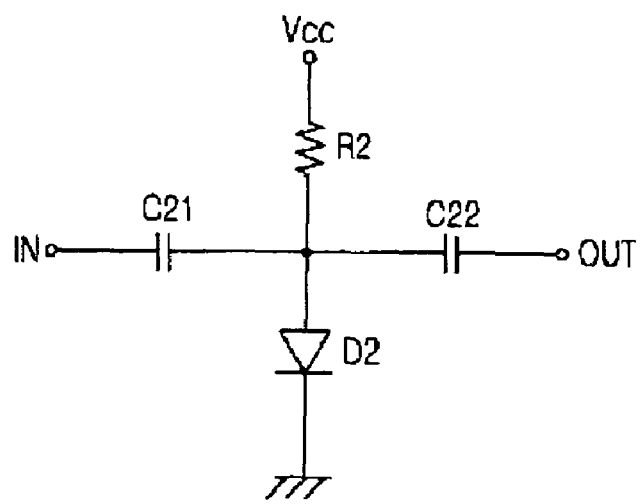
FIG. 2 is a circuit diagram of a conventional parallel diode predistorter.
Figure 3:
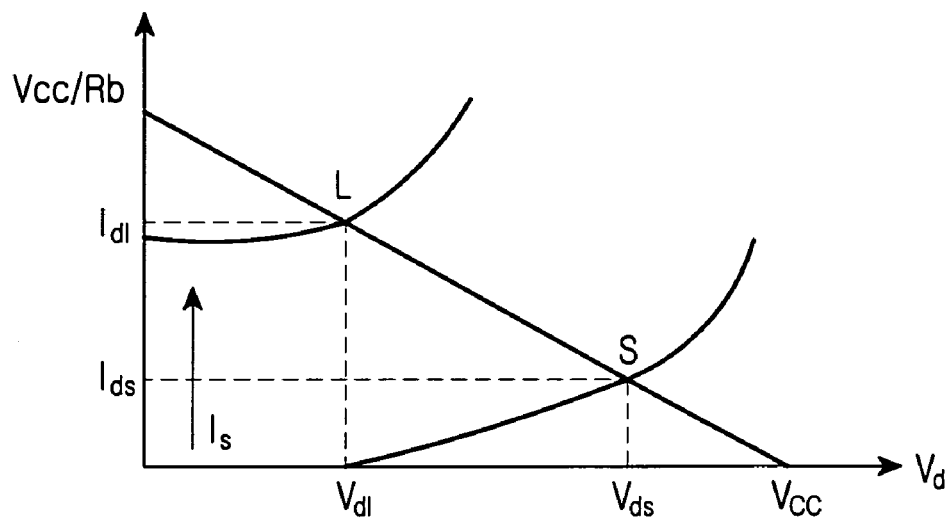
FIG. 3 illustrates a change in a bias point according to an input power of the conventional parallel diode predistorter.
Figure 4:
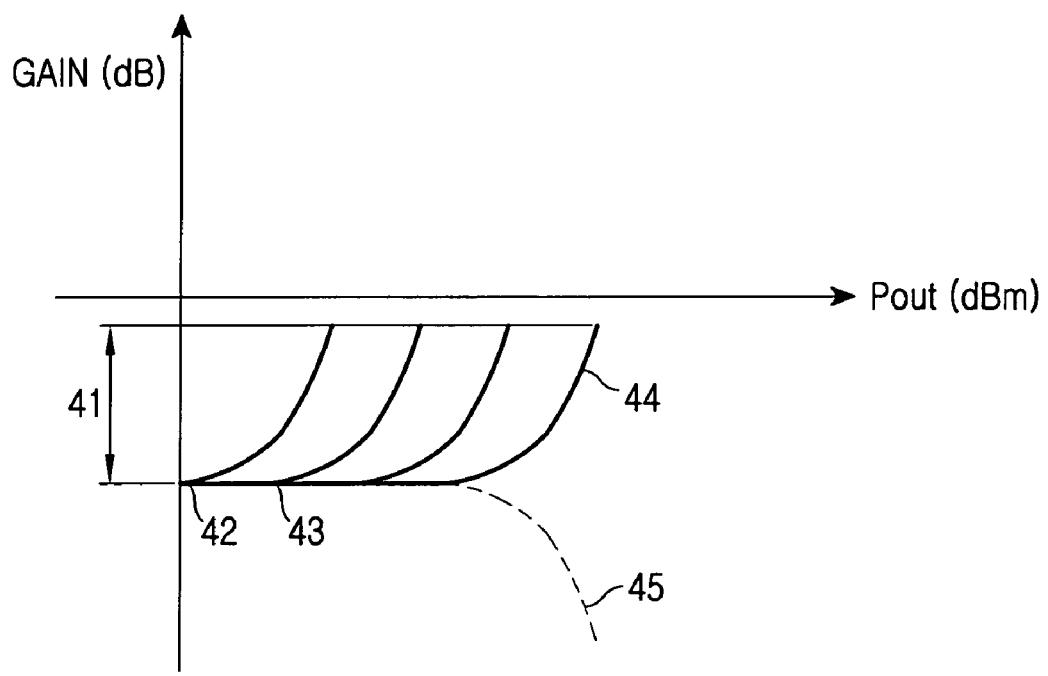
FIG. 4 illustrates a gain characteristic of a predistorter suitable for a multimode and a multiband.
Figure 5:
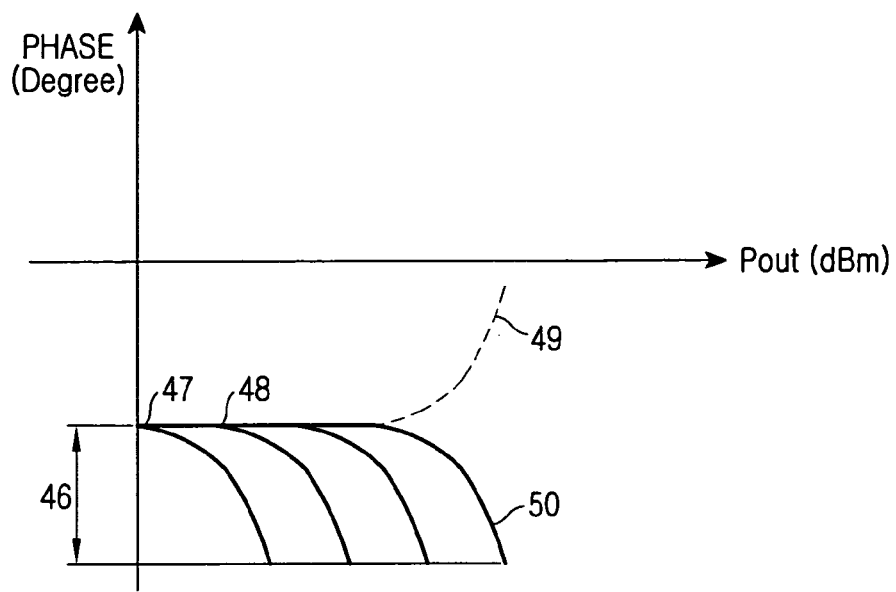
FIG. 5 illustrates a phase characteristic of a predistorter suitable for a multimode and a multiband.
Figure 6:
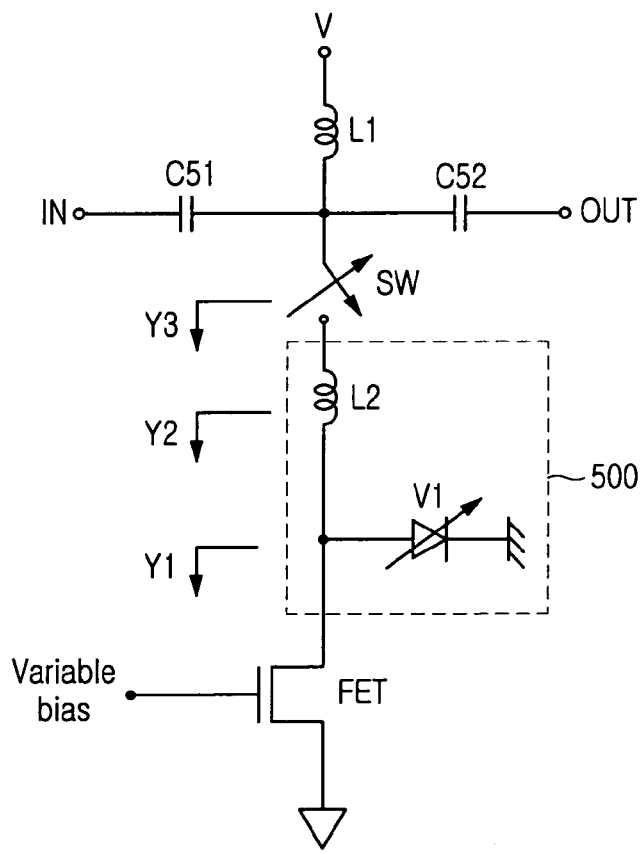
FIG. 6 is a circuit diagram of a predistorter according to a first embodiment of the present invention.

FIG. 6 is a circuit diagram of a predistorter according to a first embodiment of the present invention. Referring to FIG. 6, the predistorter includes a field-effect transistor FET that uses a variable gate bias voltage, an impedance transform unit 500 connected to a drain of the field-effect transistor FET to perform impedance transform, a first inductor L1 connected between the impedance transform unit 500 and a voltage V, a switch SW connected between the impedance transform unit 500 and the first inductor L1 to control a multimode, a first capacitor C51 connected between a power input terminal IN and the switch SW, and a second capacitor C52 connected between a power output terminal OUT and the switch SW. The impedance transform unit 500 includes a varactor V1 having a cathode connected to the ground and an anode connected to the drain of the field-effect transistor FET and a second inductor L2 connected between the switch SW and the varactor V1.

The predistorter of FIG. 6 supports a multiband, which means that a conductance G and a susceptance B of the predistorter cover the entire Smith chart. In the present invention, the field-effect transistor FET controls the conductance G and the susceptance B.

An impedance of the field-effect transistor FET changes according to an input power. The field-effect transistor FET controls the variable gate bias voltage to change turning points of a gain or a phase.

An operation of the field-effect transistor FET will be described in detail with reference to FIG. 7.

Figure 7:
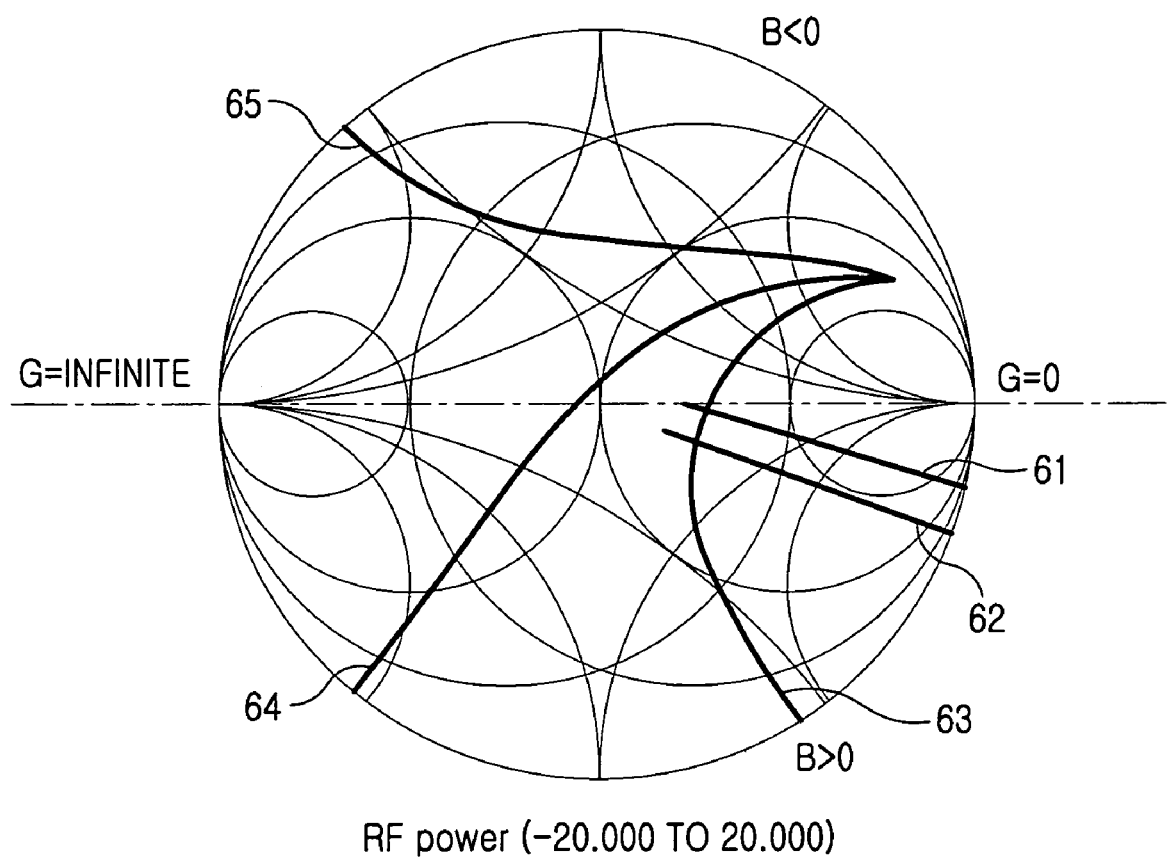
FIG. 7 illustrates a Smith chart for reference in explaining the present invention.

The conductance G and the susceptance B change as indicated by 61 in FIG. 7. Herein, it can be seen that the susceptance B hardly ever changes and the conductance G increases as an input power increases.

With respect to the conductance G that increases with an increase in the input power, the impedance transform unit 500 controls a capacitor value of the varactor V1 as indicated by 62 to increase the susceptance B and performs impedance transform using the second inductor L2, such that an impedance is distributed as indicated by 63 through 65 or in other positions. That is, a multiband is controlled by the capacitor value of the varactor V1 of FIG. 6.

In the present invention, through bias voltage control of the field-effect transistor FET and impedance control of the impedance transform unit 500, it is possible to control a gain and a phase to linearize the nonlinearity of a power amplifier.

The voltage V provides a bias voltage to the field-effect transistor FET and the first inductor L1 is used as a choke for applying the bias voltage to the field-effect transistor FET. The first capacitor C51 and the second capacitor C52 function as DC block capacitors for an input and an output, respectively.

Figure 8:
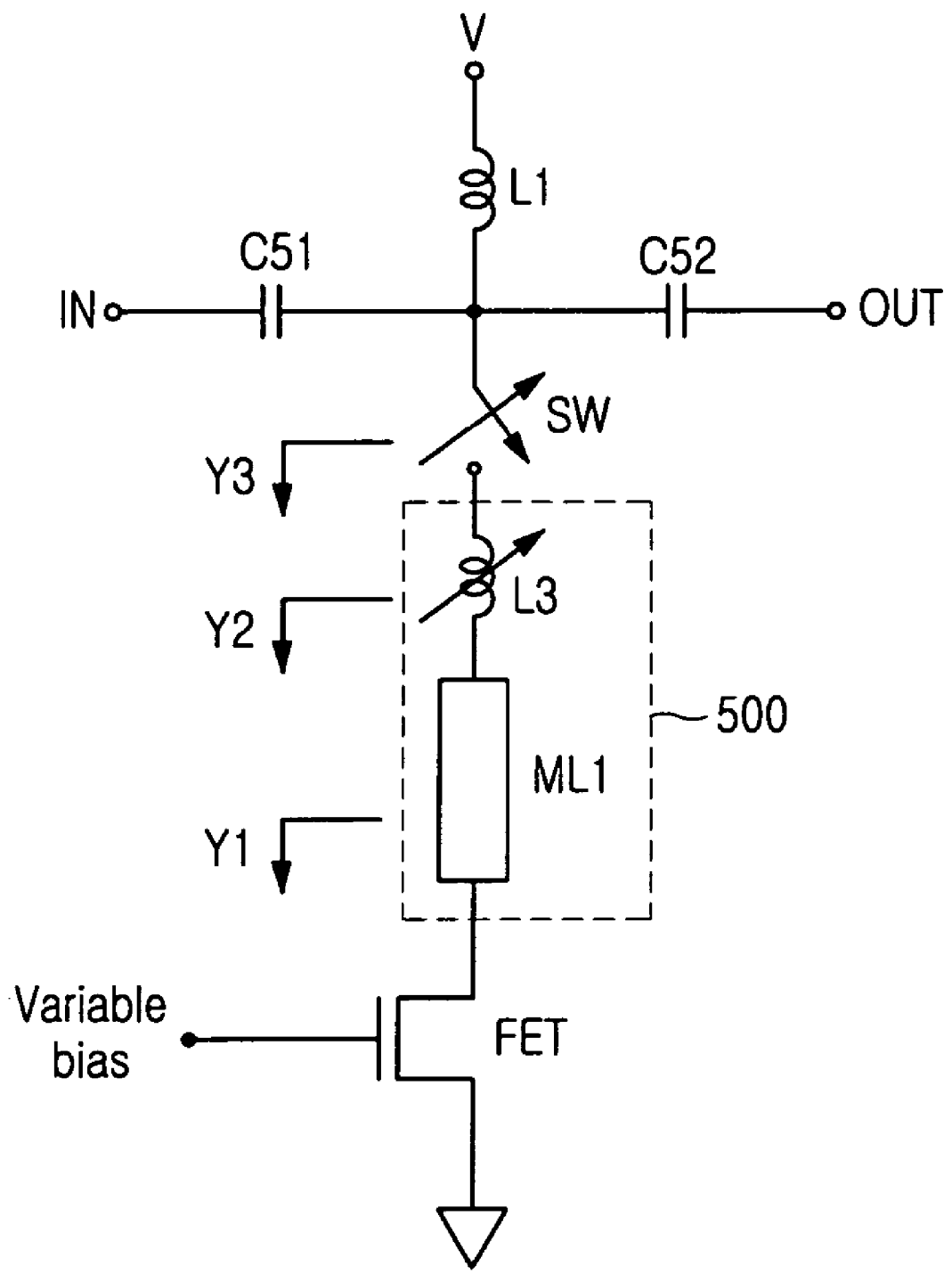
FIG. 8 is a circuit diagram of a predistorter according to a second embodiment of the present invention.
Figure 9:
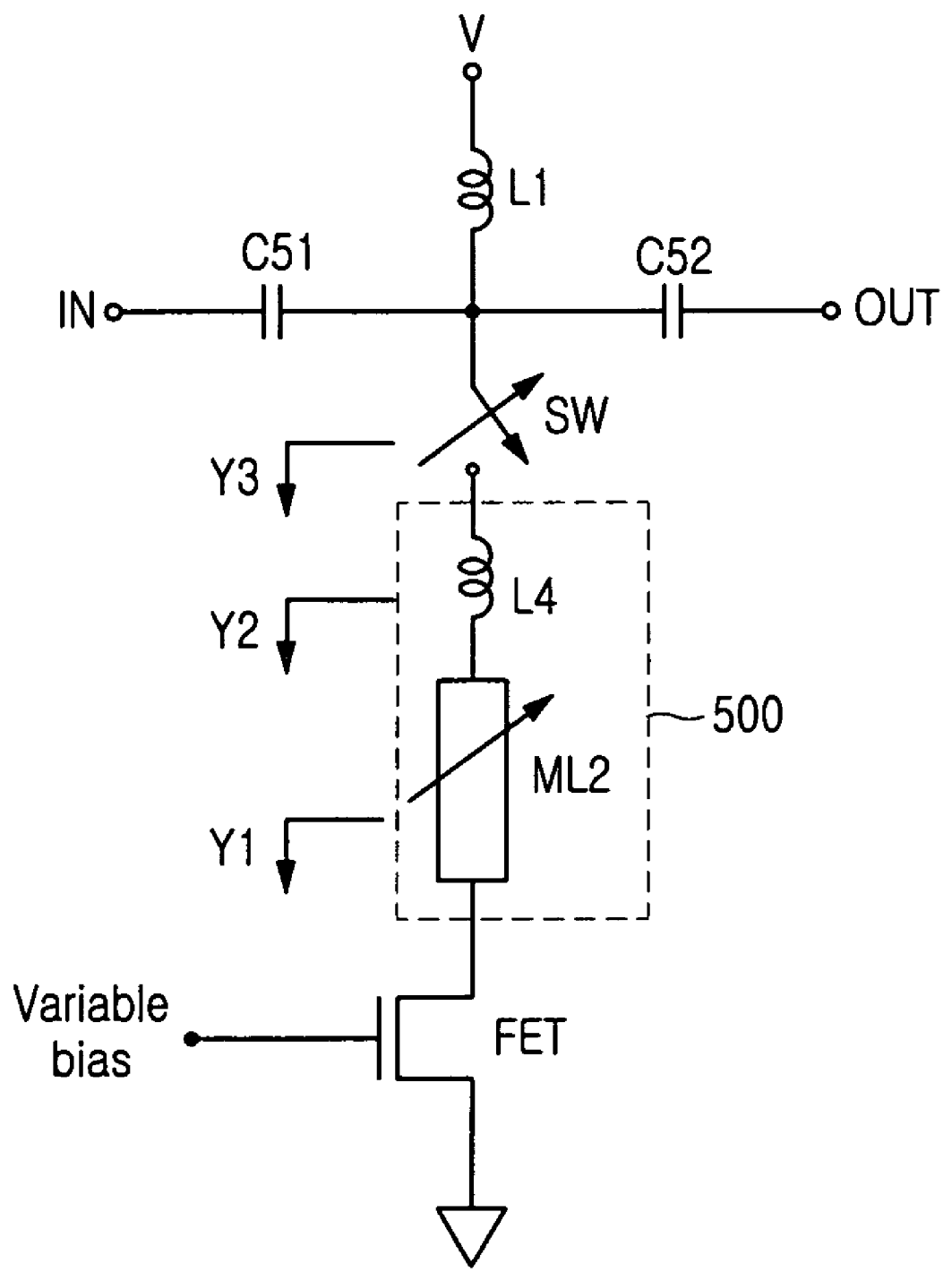
FIG. 9 is a circuit diagram of a predistorter according to a third embodiment of the present invention.
Figure 10:
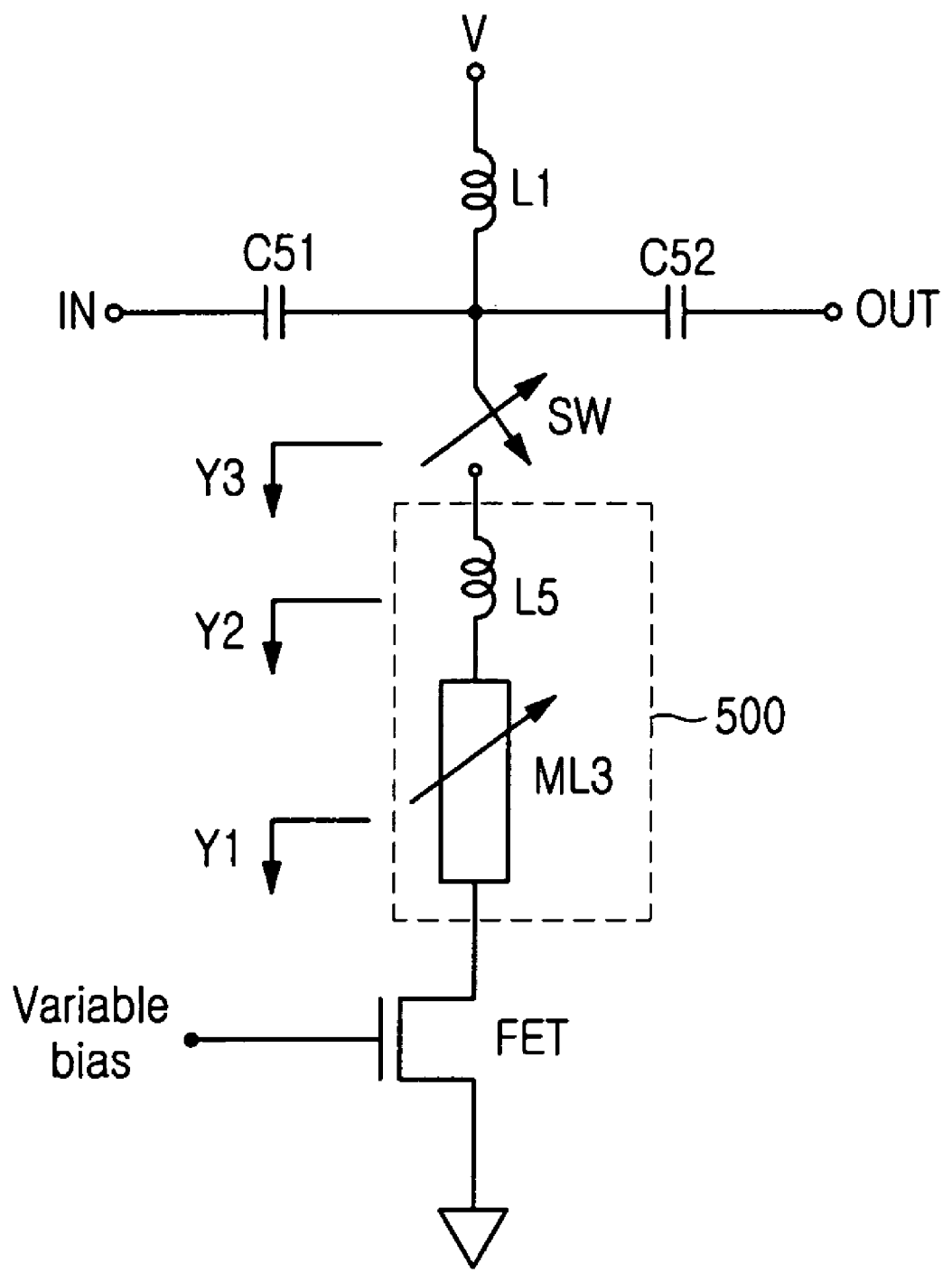
FIG. 10 is a circuit diagram of a predistorter according to a fourth embodiment of the present invention.

The impedance transform unit 500 can be implemented variously as illustrated in FIGS. 8 through 10. In FIGS. 8 through 10, identical components as in FIG. 6 are indicated by identical reference numerals and descriptions thereof will be omitted.

FIG. 8 is a circuit diagram of a predistorter having an impedance transform unit 500 including a variable inductor L3 and a microstrip line ML1. In FIG. 8, a multiband is controlled by the variable inductor L3.

FIG. 9 is a circuit diagram of a predistorter having an impedance transform unit 500 including an inductor L4 and a microstrip line ML2 having variable impedance. In FIG. 9, a multiband is controlled by the microstrip line ML2 having the variable impedance.

FIG. 10 is a circuit diagram of a predistorter having an impedance transform unit 500 including an inductor L5 and a microstrip line ML3 having a variable length. In FIG. 10, a multiband is controlled by the microstrip line ML3 having a variable length.

Y3 in FIG. 6 and FIGS. 8 through 10 can be expressed as described below.

$$Y3 = \frac{G1 + j\,[(B1 + Yo\tan\theta) - \varpi L\{(B1 + Yo\tan\theta)^2 + G1^2\}]}{\varpi^2 L^2[(B1 + Yo\tan\theta)^2 + G1^2] - 2\varpi L(B1 + Yo\tan\theta) + 1}, \quad (4)$$

Assuming that K=B1+Yo tan θ, Equation (4) can be rewritten as follows.

$$Y3 = \frac{G1 + j\,[K - \varpi L(K^2 + G1^2)]}{\varpi^2 L^2(K^2 + G1^2) - 2\varpi LK + 1} \quad (5)$$

$$= \frac{G1 + j\,[K - \varpi L(K^2 + G1^2)]}{G1^2\varpi^2 L^2 + K^2\left(\varpi L - \frac{1}{K}\right)^2} = G3 + jB3,$$

It can be noted from Equation (5) that Y3 depends on a value of the inductor (L2, L3, L4, or L5) included in the impedance transform unit 500 and K that changes according to a phase and an admittance of the microstrip line (ML1, ML2, or ML3).

Because S21 of the predistorter illustrated in FIG. 6 and FIGS. 8 through 10 is expressed as Equation 6, a gain and a phase of the predistorter illustrated in FIG. 6 and FIGS. 8 through 10 can be expressed as Equations (7) and 8.

$$S21 = \frac{2}{2 + Z_T Y3} = \frac{2}{2 + Z_T Y3} = \frac{2}{2 + Z_T(G3 + jB3)} \quad (6)$$

$$|S21| = \frac{2}{\sqrt{(2 + Z_T G3)^2 + (Z_T B3)^2}} \quad (7)$$

$$\angle S21 = \tan^{-1}\left(\frac{-Z_T B3}{2 + Z_T G3}\right) \approx \tan^{-1}\left(\frac{-Z_T B3}{2}\right) \quad (8)$$

Hereinafter, a description will be made regarding an operation of the predistorter illustrated in FIG. 6, when the predistorter is used in a system that uses Global System for Mobile communication (GSM), Code Division Multiple Access (CDMA) 800 MHz, and CDMA 1800 MHz.

For GSM, because the GSM does not require a predistorter, the switch SW is turned off. For CDMA 800 MHz and CDMA 1800 MHz, because the nonlinearity of a power amplifier should be compensated for, the switch SW is turned on. However, in practice, CDMA 800 MHz and CDMA 1800 MHz are likely to be different from each other in terms of characteristics of AM-AM distortion and AM-PM distortion. Therefore, the varactor V1 is controlled to control a deviation and a direction of a phase.

For example, a capacitor value of the varactor V1 is controlled to be 3 pF in the case of CDMA 800 MHz and a capacitor value of the varactor V1 is controlled to be 0.25 pF for CDMA 1800 MHz. In addition, by controlling the gate bias voltage of the field-effect transistor FET, it is possible to control a turning point at which a gain or a phase of the predistorter starts to change according to an input power.

As described above, the nonlinearity of a power amplifier in a system capable of supporting a multiband and a multimode can be linearized using a varactor or a variable microstrip line.

In addition, it is possible to linearize characteristics of AM-AM distortion and AM-PM distortion that change with external environment factors such as a temperature and a load of a power amplifier, using the predistorter according to the present invention in any given frequency band.

Because the predistorter according to the present invention consumes little current, it does not degrade the efficiency of the entire system like a conventional active predistorter.

While the present invention has been shown and described with reference to certain preferred embodiments thereof, it will be understood by those skilled in the art that various changes in form and details may be made therein without departing from the spirit and scope of the invention.

What is claimed is:

1. A predistorter at a front end of a power amplifier to linearize nonlinearity of the power amplifier, the predistorter comprising:
   a field-effect transistor having a source connected to a ground and using a variable gate bias voltage:
   an impedance transform unit connected to a drain of the field-effect transistor to perform impedance transform;
   a first inductor connected between the impedance transform unit and a voltage provided to the field-effect transistor;
   a first capacitor connected between a power input terminal and the impedance transform unit; and
   a second capacitor connected between a power output terminal and the impedance transform unit;
   wherein the impedance transform unit comprises:
      a varactor having a cathode connected to the ground and an anode connected to the drain of the field effect transistor; and
      a second inductor connected between the first inductor and the varactor.

2. The predistorter of claim 1, further comprising a switch connected between the impedance transform unit and the first inductor.

3. A predistorter at a front end of a power amplifier to linearize nonlinearity of the power amplifier, the predistorter comprising:
   a field-effect transistor having a source connected to a ground and using a variable gate bias voltage;
   an impedance transform unit connected to a drain of the field-effect transistor to perform impedance transform;
   a first inductor connected between the impedance transform unit and a voltage provided to the field-effect transistor;
   a first capacitor connected between a power input terminal and the impedance transform unit; and
   a second capacitor connected between a power output terminal and the impedance transform unit;
   wherein the impedance transform unit comprises:
      a microstrip line connected to the drain of the field-effect transistor; and
      a inductor connected between the inductor and the microstrip line.

4. The predistorter of claim 3, further comprising a switch connected between the impedance transform unit and the first inductor.

5. A predistorter at a front end of a power amplifier to linearize nonlinearity of the power amplifier, the predistorter comprising:
   a field-effect transistor having a source connected to a ground and using a variable gate bias voltage;
   an impedance transform unit connected to a drain of the field-effect transistor to perform impedance transform;
   a first inductor connected between the impedance transform unit and a voltage provided to the field-effect transistor;
   a first capacitor connected between a power input terminal and the impedance transform unit; and
   a second capacitor connected between a power output terminal and the impedance transform unit;
   wherein the impedance transform unit comprises:
      a microstrip line connected to the drain of the field-effect transistor and having a variable impedance; and
      a inductor connected between the first inductor and the microstrip line.

6. The predistorter of claim 5, further comprising a switch connected between the impedance transform unit and the first inductor.

7. A predistorter at a front end of a power amplifier to linearize nonlinearity of the power amplifier, the predistorter comprising:
   a field-effect transistor having a source connected to a ground and using a variable gate bias voltage;
   an impedance transform unit connected to a drain of the field-effect transistor to perform impedance transform;
   a first inductor connected between the impedance transform unit and a voltage provided to the field-effect transistor;
   a first capacitor connected between a power input terminal and the impedance transform unit; and
   a second capacitor connected between a power output terminal and the impedance transform unit;
   wherein the impedance transform unit comprises:
      a microstrip line connected to the drain of the field-effect transistor and having a variable length; and
      a inductor connected to the first inductor and the microstrip line.

8. The predistorter of claim 7, further comprising a switch connected between the impedance transform unit and the first inductor.

* * * * *